United States Patent [19]
Craig

[11] Patent Number: 5,967,854
[45] Date of Patent: *Oct. 19, 1999

[54] CIRCUIT CONNECTOR

[75] Inventor: Peter Craig, Kanata, Canada

[73] Assignee: Mitel Corporation, Kanata, Canada

[ * ] Notice: This patent issued on a continued prosecution application filed under 37 CFR 1.53(d), and is subject to the twenty year patent term provisions of 35 U.S.C. 154(a)(2).

[21] Appl. No.: 08/902,833

[22] Filed: Jul. 30, 1997

[51] Int. Cl.⁶ .................................................. H01R 23/02
[52] U.S. Cl. ............................................ 439/676; 439/344
[58] Field of Search ................................ 439/67, 77, 676, 439/344, 946.2

[56] References Cited

U.S. PATENT DOCUMENTS

| | | | |
|---|---|---|---|
| 3,365,694 | 1/1968 | Parker | 439/353 |
| 4,635,359 | 1/1987 | Nozick | 439/67 |
| 4,720,269 | 1/1988 | Haskins et al. | 439/676 |
| 4,934,947 | 6/1990 | Brummans et al. | 439/77 |
| 5,183,404 | 2/1993 | Aldous | 439/55 |
| 5,385,478 | 1/1995 | Kawasaki | 439/67 |
| 5,547,405 | 8/1996 | Pinney et al. | 439/676 |

FOREIGN PATENT DOCUMENTS

94/08366  4/1994  WIPO .

*Primary Examiner*—Neil Abrams
*Assistant Examiner*—T C Patel
*Attorney, Agent, or Firm*—Marks & Clerk

[57] ABSTRACT

An arrangement for connecting a printed circuit to a plug of the type having a plurality of parallel contacts located on the edge of an insertion block provided with a resilient detent, includes a housing containing the printed circuit, and an opening in the housing for retaining the insertion block therein. A flexible extension of the printed circuit has parallel contacts formed thereon. The flexible extension extends at an angle through the opening so that the parallel contacts thereon make contact with the parallel contacts on an insertion block retained in the opening.

6 Claims, 1 Drawing Sheet

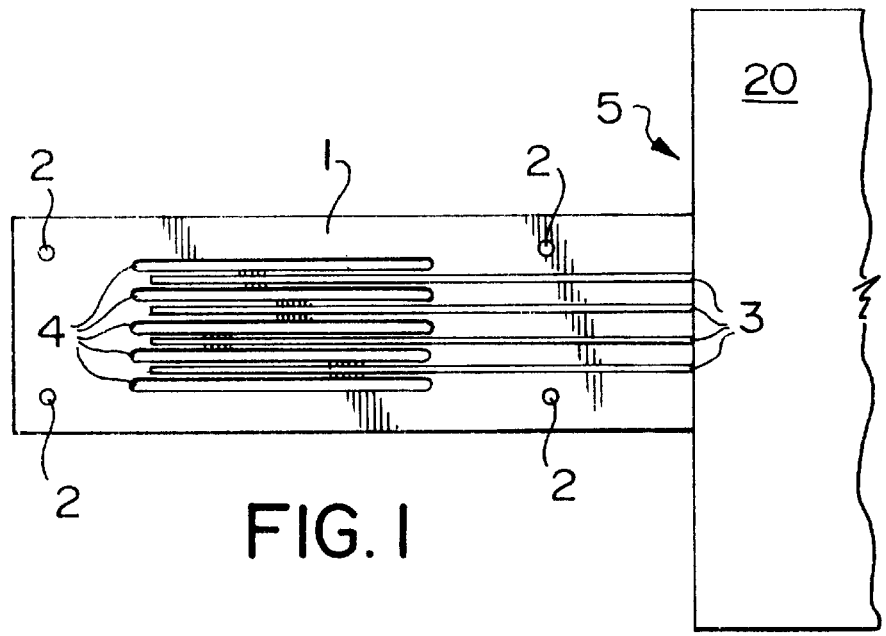
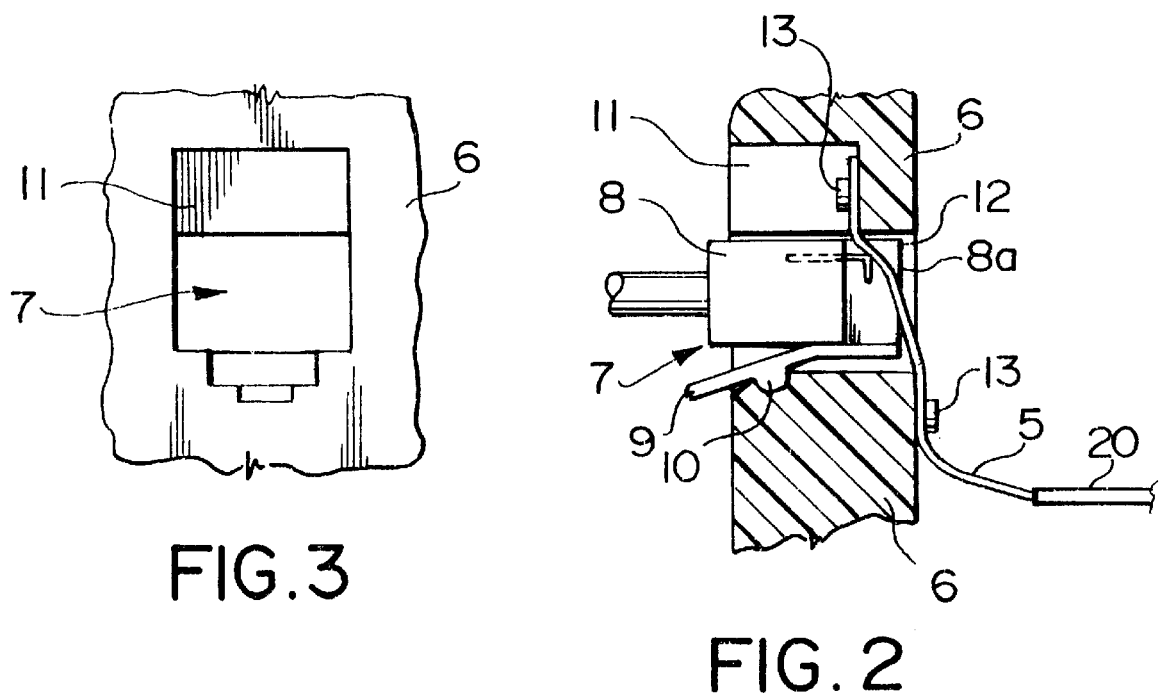

CIRCUIT CONNECTOR

FIELD OF THE INVENTION

This invention relates to a circuit connector, more particularly for use in association with flexible printed circuits for electronic devices.

BACKGROUND OF THE INVENTION

With the trend towards using flexible circuits in terminal devices, such as telephones, the interface between the device and external circuits is usually by standard teledapt cables. The standard method utilizes a telephone jack that can either be board mounted, flexible circuit mounted or connected to the printed circuit by wires. Each case had its drawbacks, either mechanical strength or further connection to the flexible circuit.

An object of the invention is to simplify the construction.

SUMMARY OF THE INVENTION

According to the present invention there is provided a connector arrangement comprising a wall portion of a housing for an electronic device other than said connector arrangement, said wall portion having an opening extending completely therethrough with an inwardly facing side and an outwardly facing side, an insertion block provided with a resilient detent and a plurality of parallel contacts located at an edge thereof, said insertion block being retained in said opening on said outwardly facing side; and a printed circuit for said electronic device and including a substrate comprising a main part located in said housing and a resiliently flexible extension of unitary construction therewith, said flexible extension having corresponding mating parallel contacts formed thereon, and said flexible extension extending at an angle across said opening of said wall portion on said inwardly facing side so as to resiliently oppose the insertion of said insertion block into said opening and ensure that said mating contacts on said flexible extension establish direct contact with the corresponding parallel contacts of said insertion block retained in said opening, whereby the need for a separate jack to establish connection with said printed circuit is eliminated in the housing adapted to retain a the insertion block therein, a flexible extension of the printed circuit having parallel contacts formed thereon, and the flexible extension extending at an angle through the opening so that the parallel contacts thereon make contact with the parallel contacts on a the insertion block retained in the opening.

The insertion block is preferably a standard teledapt connector of the type designed to fit into an ordinary telephone jack.

The extension can be in the shape of a shaped tail on the flexible circuit which is of unitary construction with the main portion of the printed circuit.

Preferably, the detent is resiliently engaged in a recess in the wall of the opening.

With this design there is no need for the telephone jack. Direct connection between the flexible circuit and the teledapt cable is established in such a way that the connect/disconnect function is not lost.

BRIEF DESCRIPTION OF THE DRAWINGS

The invention will now be described in more detail, by way of example only, with reference to the accompanying drawings, in which:

FIG. 1 is a plan view of a printed circuit board extension; and

FIG. 2 is a cross sectional view of part an arrangement in accordance with the invention; and FIG. 3 is an end view of the arrangement shown in FIG. 2, showing the aperture for the insertion block.

DESCRIPTION OF THE PREFERRED EMBODIMENTS

FIG. 1 shows a rectangular extension 1 of a flexible printed circuit. The rectangular extension has four mounting holes 2. Four contacts 3 are formed on the extension 1 and consist of conductive tracks connected directly to the main part 20 of the printed circuit and formed in the conventional manner.

The terminal portions of the contacts 3 are embraced by parallel longitudinal slits 4.

FIG. 2 shows a part of a wall 6 of a housing (not shown) for an electronic device incorporating the flexible printed circuit 5. This includes an opening 7, which has a shape as shown in FIG. 3, that accommodates an insertion block 8, which may, for example, be a conventional teledapt plug having a reslient detent 9 on its underside. The detent 9 has a lug 10, which resiliently engages in a corresponding recess in the bottom wall of the opening 7 to prevent the insertion block 8 from being pulled out of the opening 7 without the detent 9 first being released. The upper innermost corner includes a plurality of parallel L-shaped contact wires 14 extending round the corner and separated by vertical partition walls.

The extension 1 is stretched diagonally from the bottom to the top of the opening and retained by studs 13 on the wall portion 6 that are located in the mounting holes 2. A rectangular recess 11 is cut into the outside of the wall 6 to permit the upper end of the extension 1 to be located closer to the rear surface of the wall, although if necessary it can be located on the front surface.

In use, the insertion block 8 is inserted into the opening 7 and pushed until the end 8a comes into contact with the extension 1. This flexes resiliently as the parallel contact wires on the inner upper corner of the insertion block come into contact with the conductive tracks 3 on the extension 1 until the lug 10 on the detent 9 becomes engaged in its corresponding recess. The partition walls 12 formed on the insertion block 8 between the parallel contacts thereon enter the slots 4 formed on either side of the conductive tracks 3. Thus it will be seen that by shaping the end of the flexible circuit and mounting it in the terminating housing, of the electronic device connection is achieved when the teledapt cable is inserted into the opening. If the mounting features in the terminating device are designed to position, guide and lock the teledapt as in a telephone jack then connect/disconnect functions are not lost.

As described, the connection relies on the tension in the flexible circuit substrate caused by the interference with the teledapt to provide the contact force between the conductors on the teledapt and the conductive traces on the flexible circuit. Another method of achieving this is to pre-form the flexible circuit into a dome shape. Then the cut fingers formed between the slits 4 will act as individual leaf springs to achieve the contact force on interference with the teledapt.

The mounting of the flexible circuit and the guiding/locking of the teledapt cable is incorporated into the housing of the terminating device. This can also be incorporated in a separate molded piece similar to a telephone Jack that can then allow connection independently of the enclosure.

I claim:

1. A connector arrangement comprising:

a wall portion of a housing for containing a functional electronic device, said wall portion having an opening extending completely therethrough with an inwardly facing side and an outwardly facing side, an insertion block provided with a resilient detent and a plurality of parallel contacts located at an edge thereof, said insertion block being retained in said opening on said outwardly facing side; and a printed circuit for said electronic device and including a substrate comprising a main part located in said housing and a resiliently flexible extension of unitary construction therewith, said flexible extension having corresponding mating parallel contacts formed thereon, and said flexible extension extending at an angle across said opening of said wall portion on said inwardly facing side so as to resiliently oppose the insertion of said insertion block into said opening and ensure that said mating contacts on said flexible extension establish direct contact with the corresponding paralle contacts of said insertion block retained in said opening, whereby the need for a separate jack to establish connection with said printed circuit is eliminated.

2. A connector arrangement as claimed in claim 1, wherein a recess is formed in a wall of said opening to resiliently accommodate said detent and retain said insertion block in said opening.

3. A connector arrangement as claimed in claim 1, wherein parallel slits are formed alongside said mating parallel contacts on said flexible extension to receive partition walls provided on said insertion block.

4. A connector arrangement as claimed in claim 3, wherein tension in said extension creates a contact force between opposing parallel contacts.

5. A connector arrangement as claimed in claim 1, wherein one end of the extension is located in a recess cut into said wall portion outside said opening.

6. A connector arrangement as claimed in claim 3, wherein said insertion block is a teleadapt plug for insertion into a standard telephone jack.

* * * * *